(12) United States Patent
Mazumder et al.

(10) Patent No.: US 6,546,510 B1
(45) Date of Patent: Apr. 8, 2003

(54) BURN-IN MODE DETECT CIRCUIT FOR SEMICONDUCTOR DEVICE

(75) Inventors: Kallol Mazumder, West Bengal (IN);
Scott E. Smith, Sugar Land, TX (US);
Francis Hii, Singapore (SG)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/351,384

(22) Filed: Jul. 13, 1999

Related U.S. Application Data

(60) Provisional application No. 60/092,536, filed on Jul. 13, 1998.

(51) Int. Cl.$^7$ ............................................. G11C 29/00
(52) U.S. Cl. ........................................ 714/718; 365/201
(58) Field of Search .................. 714/718, 25; 365/201; 324/760

(56) References Cited

U.S. PATENT DOCUMENTS

| | | | | |
|---|---|---|---|---|
| 5,463,636 A | * | 10/1995 | Nakayama | ................... 714/25 |
| 5,557,559 A | * | 9/1996 | Rhodes | ....................... 702/118 |
| 5,956,279 A | * | 9/1999 | Mo et al. | ..................... 365/201 |
| 6,037,792 A | * | 3/2000 | McClure | ..................... 324/760 |

* cited by examiner

Primary Examiner—Albert Decady
Assistant Examiner—Shelly A Chase
(74) Attorney, Agent, or Firm—Frederick J. Telecky, Jr.; W. James Brady III

(57) ABSTRACT

A synchronous dynamic random access memory (SDRAM) is disclosed that includes an operational mode in which the functionality of the SDRAM can be tested under burn-in conditions. The SDRAM can be placed in a burn-in monitor mode in which burn-in information is provided at data outputs, in lieu of memory cell information. The burn-in monitor mode helps to ensure that the SDRAM functions are properly exercised during burn-in. The preferred embodiment includes a data buffer coupled to a data bus and a mode register. The mode register stores burn-in mode data. In a standard mode of operation, the data buffer couples the data bus to data outputs (D0-Dz). In a burn-in monitor mode of operation, the data buffer couples the burn-in mode data to the data outputs (D0-Dz).

20 Claims, 5 Drawing Sheets

BURN-IN MODE DETECT CIRCUIT FOR SEMICONDUCTOR DEVICE

This application claims priority under 35 USC §119(e)(1) of provisional application No. 60/092,536 filed Jul. 13, 1998.

TECHNICAL FIELD

The present invention relates generally to semiconductor integrated circuits, and more particularly to circuits for detecting operational modes while a semiconductor integrated circuit is undergoing a burn-in operation.

BACKGROUND OF THE INVENTION

An important step in ensuring the reliability of semiconductor devices is "burn-in." While modern semiconductor manufacturing processes result in very low defect densities, defects can still occur due to uncontrollable factors, such as inherent variations in the manufacturing process. While some types of defects may be immediately detected by testing the devices, other types of defects can result in "infant" mortality. Infant mortality defects, while not immediately apparent, arise after a device has been operational for a short period of time, resulting in semiconductor devices which have an abnormally short lives.

In order to eliminate infant mortality defects, semiconductor devices are often screened in a "back-end" (i.e., post wafer fabrication) manufacturing step, referred to as "burn-in." During burn-in, power is applied to semiconductor devices for a prolonged period of time to induce infant mortality failures. To accelerate infant mortality failures, the burn-in step can be conducted at elevated power supply voltages and/or temperatures. In the latter case, semiconductor devices are powered-up within a burn-in oven. In the former case, the semiconductor devices may include specialized circuitry to apply a higher than normal voltage to the circuits within.

In some burn-in operations, the functions of a semiconductor device are exercised under the burn-in stress. In such cases, the semiconductor is essentially "tested" during burn-in. For semiconductor devices having relatively few functions, the testing process can be rapidly performed. For more complex semiconductor devices, the testing process can be relatively lengthy. For example, in the case of semiconductor memory devices, it may be desirable to test each memory location during burn-in in order to screen all the memory cells of the device for infant mortality type defects. Such an approach can require relatively long periods of time, as millions of such memory cells have to be accessed by unique addresses.

One way in which to increase the speed at which a semiconductor device's functions may be exercised, is to include built-in testing circuits on the semiconductor device itself. Such testing circuits are often referred to as "design-for-test" (DFT) circuits. Among the types of DFT circuits in semiconductor memory devices, are those which automatically cycle through the various memory locations of the memory device, reading and writing data into each memory location. In larger semiconductor devices, which are internally divided into banks, the DFT circuit may exercise the various semiconductor memory device functions on a bank-by-bank basis, or on a multiple bank basis (i.e., write data into all banks simultaneously).

The DFT circuits are usually implemented by placing the semiconductor device in a DFT mode. For example, in the case of a large density semiconductor memory device, during burn-in, the DFT circuits would initially access a first bank of memory cells, and then access a second bank, and continue in this manner until the functions of each bank of the device have been exercised.

A problem associated with burn-in can arise when a command is applied to the semiconductor device to place it in a burn-in mode, and the device, due to noise or other reasons does not actually enter the burn-in mode. In such an event, the device may not receive the increased burn-in voltage, and hence infant mortality defects can be missed. Similar problems can arise in the event the semiconductor device does not enter the correct DFT mode during burn-in, or does not correctly transition from one DFT mode (activating a first bank, for example) to a another (activating a second bank, for example). In such an event, a certain portion of the semiconductor device may not be stressed by the burn-in operation and can subsequently fail at a later time.

It would be desirable to arrive at some way to ensure that devices are properly placed in a burn-in mode, and that DFT circuits within devices are properly enabled during a burn-in operation.

SUMMARY OF THE INVENTION

According to the preferred embodiment, a synchronous dynamic random access memory (SDRAM) includes a burn-in mode, in which the functionality of the SDRAM can be tested under burn-in conditions. The SDRAM can be placed in a burn-in monitor mode in which burn-in information is provided at data outputs, instead of memory cell information. The burn-in monitor mode helps to ensure that the SDRAM is properly exercised during burn-in.

According to one aspect of the preferred embodiment, the SDRAM includes a data buffer coupled to a data bus and a mode register. The mode register stores burn-in mode data. In a standard mode of operation, the data buffer couples the data bus to data outputs. In a burn-in monitor mode of operation, the data buffer couples the burn-in mode data to the data outputs.

According to another aspect of the preferred embodiment, the SDRAM includes a number of memory cell banks that must be activated in order to access the memory cells within. Activation of a memory cell bank while the SDRAM is in the burn-in monitor mode will automatically take the SDRAM out of the burn-in monitor mode. This eliminates the need for a separate "exit burn-in monitor test" command each time the memory cells are to be accessed.

According to another aspect of the preferred embodiment, the SDRAM includes a clock buffer circuit that provides an internal clock signal for the SDRAM. The clock buffer circuit automatically introduces hysteresis into the internal clock signal in a burn-in mode. The test can query the device to verify that the correct DFT parallel test, mode register settings such as burst length and read latency, clock hysteresis activation, and burn-in stress voltage are being applied.

DETAILED DESCRIPTION OF THE EMBODIMENTS

Figure 1:
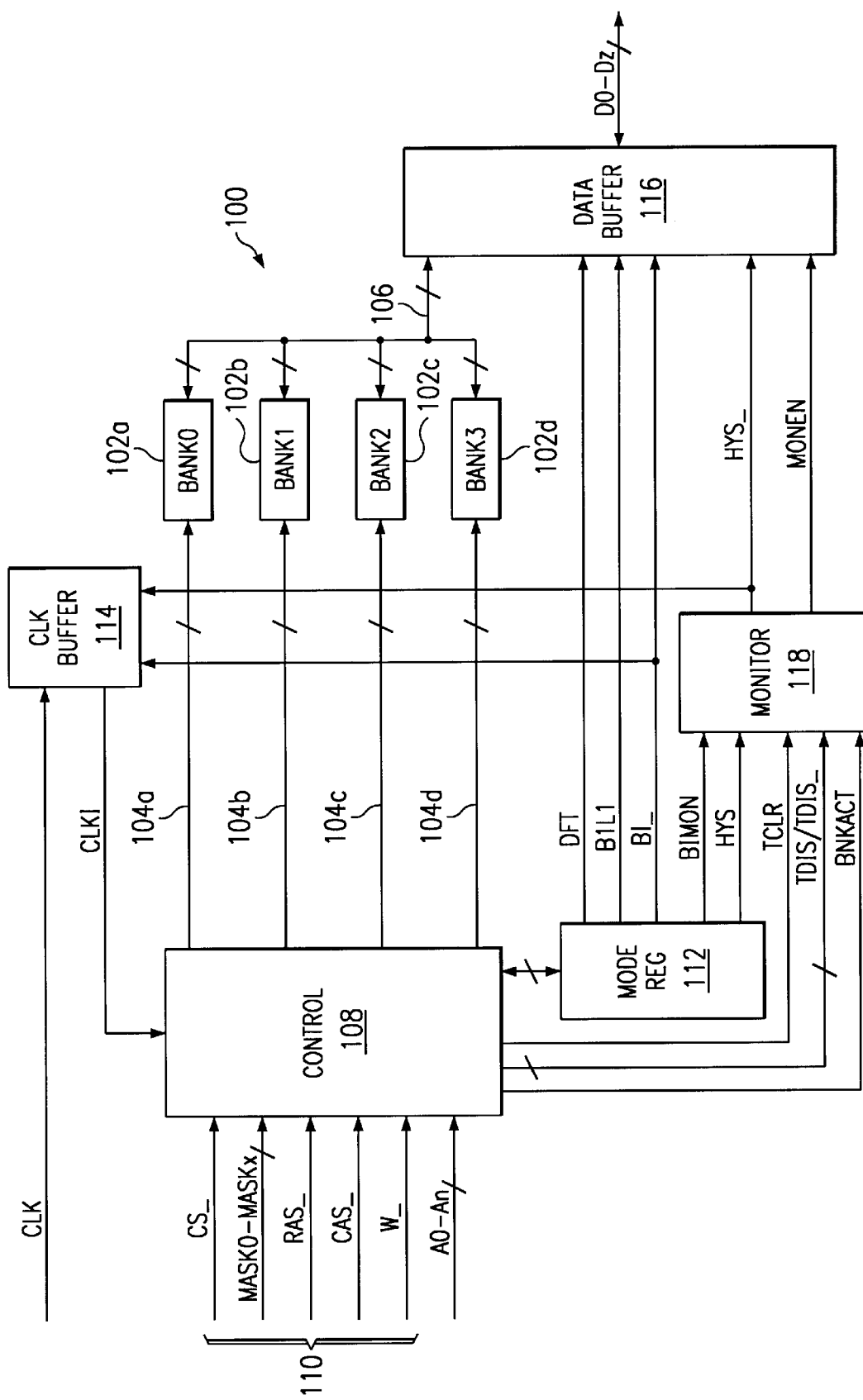
FIG. 1 is a block schematic diagram illustrating a preferred embodiment.

Referring now to FIG. 1, a block schematic diagram is set forth illustrating a preferred embodiment. The preferred embodiment is a semiconductor memory device, such as a synchronous dynamic random access memory (SDRAM), as just one example. The preferred embodiment includes circuits that provide burn-in mode data on selected data outputs. The burn-in mode data allows the semiconductor memory device to be monitored during burn-in, to ensure that the memory device has properly entered a burn-in mode, and that functions necessary to exercise the device properly have been selected.

The preferred embodiment is designated by the general reference character 100, and shown to include four memory cell array banks, shown as 102a–102d. Each array bank (102a–102d) includes a plurality of memory cells arranged into a number of arrays. The memory cells within the array banks (102a–102d) are accessed according to command and address information received on associated command/address buses (104a–104d). For a given address, memory locations within an array bank are accessed via a data bus 106. Command and address information are provided by a control section 108, which receives an internal clock signal CLKI, a variety of external control signals 110, and a number of address signals A0–An. In the preferred embodiment 100 the control signals include a chip select signal (CS_), a number of data mask signals (MASK0–MASKx), row address and column address strobe signals (CAS_ and RAS_), and a write enable signal (W_).

In addition to providing the information necessary to access the various array banks (102a–102d), the control section 108 also generates mode information for storage in a mode register 112. This information can then be accessed by the control section 108 to establish the operational mode for the memory device 100. To establish the operational mode, predetermined combinations of external control signals 110, and in some instances address information, are applied. Among the types of mode information provided by the mode register 112 are design-for-test (DFT) mode information, burst length and read latency information, clock hysteresis information, and burn-in mode information. The DFT information includes data bits that indicate when the semiconductor device 100 is in a DFT mode, including the particular type of DFT mode. The burst length is the number of data locations that will be sequentially accessed in a given read or write operation. Read latency establishes the number of clock cycles that are allowed to pass between an applied CAS_ signal and the presence of data at the outputs of the semiconductor memory device. Clock hysteresis will indicate if a clock buffer circuit 114 employs hysteresis. The advantageous use of hysteresis in the preferred embodiment will be discussed at a later point herein. The burn-in mode information indicates if the memory device 100 is in the burn-in mode.

In the particular embodiment of FIG. 1, the mode register 112 is shown to provide a. number of indications shown as DFT, BI_, BIMON, and HYS. The DFT indication is at a logic high value when the semiconductor memory device 100 is in an independent-array parallel DFT mode. The B1L1 indication is at a logic high value when both the burst length and CAS_ latency are equal to one. The BI_ indication is at a logic low level when the preferred embodiment 100 is in a burn-in mode. The BIMON indication is at a logic high when the status of the semiconductor memory device is to be monitored during a burn-in operation. Finally, the HYS indication is at a logic high when hysteresis is enabled within preferred embodiment 100. The DFT, B1L1 and BI_ signals are coupled to a data buffer 116. The BI_ signal is further coupled to the clock buffer circuit 114.

The preferred embodiment 100 also includes a burn-in monitor circuit 118. The burnin monitor circuit 118 receives the BIMON and HYS indications from the mode register 112. In addition, the monitor circuit 118 also receives a variety of monitor control signals from the monitor circuit 118. The monitor control signals are generated within the control section 108 by the application of predetermined combinations of external control signals 110 and address values (A0–An) (which form a command). The monitor control signals includes a mode clear signal TCLR, used to reset the monitor circuit 118 to a non-burn-in no hysteresis mode, a test disable signal (TDIS) and its inverse (TDIS_), which prevent the BIMON and HYS indications from affecting the monitor circuit 118, and a bank activation signal (BNKACT) which is active when the control circuit 108 receives a bank activation command.

In response to the various indications and monitor control signals, the monitor circuit 118 generates a hysteresis control signal (HYS_) that is active at a low logic level, and a monitor enable signal MONEN that is active at a high logic level. The HYS_ and MONEN signals are coupled to the data buffer 116. In addition, the HYS_ signal is also coupled to the clock buffer 114.

In a standard operation (no burn-in monitoring in place) the semiconductor device 100 is accessed by the application of commands, generated by combinations of external control signals 110 and an address (A0–An) value. For example, in a read operation, a command is applied to the control section 108 to activate a given array bank and apply a row address. If it is assumed that array bank 102a is the activated array bank, a row within the array bank 102a will be enabled. Subsequently, a column address is applied and according to the control signals (a high write enable signal W_, in particular), a read operation takes place. As a result, data is placed on the data bus 106. The data is buffered in the data buffer 116, and provided on data outputs D0–Dz. The CAS_ latency and burst length of the output data are determined according to values within the mode register 112.

A write operation occurs in a similar fashion to a read operation, with the difference being that the W_ signal is low. Data on the data outputs (D0–Dz) is amplified by the data buffer 116, and placed on the data bus 106. In this manner data is written into the memory cells accessed by the row and column address.

The preferred embodiment 100 further includes a novel burn-in monitor mode. When placed in the burn-in monitor mode, the semiconductor memory device 100 provides data output values that include burn-in mode information. In particular, the data output values will indicate whether the preferred embodiment 100 is in the burn-in mode, if the device is in the individual array parallel test DFT mode, whether hysteresis is enabled, and whether the burst length and CAS_ latency are both set to one. The preferred embodiment 100 accomplishes these unique functions by overriding the conventional operation of the data buffer 116 to provide the burn-in mode information at the data outputs D0–Dz.

In general, to place the semiconductor memory device 100 in a burn-in operation, a predetermined command is applied to the control section 108 to establish certain desired operational modes. For example, hysteresis will typically be employed as the electrical environment of a burn-in oven can include a greater amount of noise. The use of hysteresis is thus advantageous in the preferred embodiment 100 because it makes the clock signal (CLKI) provided by the clock buffer 114, and hence the resulting internal functions timed off of the CLKI signal, less susceptible to noise. During burn-in, the individual array parallel test DFT mode is usually implemented to allow the cells in the array banks (102a–102d) to be accessed. Further, in order to allow testing to proceed at as quick a speed as possible, the burst length and CAS_ latency are both set to one. Accordingly, in a burn-in mode, the mode register 112 will output active DFT, B1L1 and the HYS indications. As shown in FIG. 1, the DFT and B1L1 active indications are applied to the data buffer 116.

Once the various modes for the burn-in operation have been establishes (i.e. individual array parallel test mode, hysteresis enabled, and burst and CAS_ latency equal to one), the preferred embodiment 100 is then placed into the burn-in mode. A predetermined set of control signals will apply an "enter burn-in" command to the control section 108. It is noted that entry into the burn-in mode may include the application of an "over-voltage" at one of the inputs to the semiconductor memory device. An over-voltage is a voltage that is higher than the standard power supply voltage. For example, in the event the semiconductor memory device is intended to operate at 3.3 volts, the over-voltage level could be 5 volts. Once the preferred embodiment 100 receives an "enter burn-in" command, the BI_ signal will be active.

Once the burn-in mode has been entered, a second command is applied to the control section 108 to enable the burn-in monitoring capabilities of the preferred embodiment 100. Once this command is entered, the mode register 112 will provide an active BIMON indication.

Active HYS and BIMON indications, result in active HYS_ and MONEN output signals being generated by the monitor circuit 118. The HYS_ signal is applied to the clock buffer 114 along with the BI_ signal. In the preferred embodiment 100, either an active HYS_ signal or an active MONEN signal will result in hysteresis in the clock signal CLKI. In addition, an active MONEN signal enables the bypass function of the data buffer 116. Once MONEN is active, the DFT, B1L1 and BI_ signals from the mode register 112, and the HYS_ signal from the monitor circuit 118, are provided as data outputs (D0–Dz), in lieu of data bits from the array banks (102a–102d). In this manner, when the semiconductor memory device 100 is in a burn-in monitoring mode, one or all of the burn-in operation data values (DFT. B1L1, BI_ or HYS_) can be monitored to ensure that a proper burn-in operation takes place. Collectively, the lines carrying the burn-in operation data values (DFT, B1L1, BI_ or HYS_) can be considered a monitor data bus, as they carry burn-in data to the data buffer 116 in a similar fashion to the way the data bus 106 carries array bank data to the data buffer 116.

Figure 2:
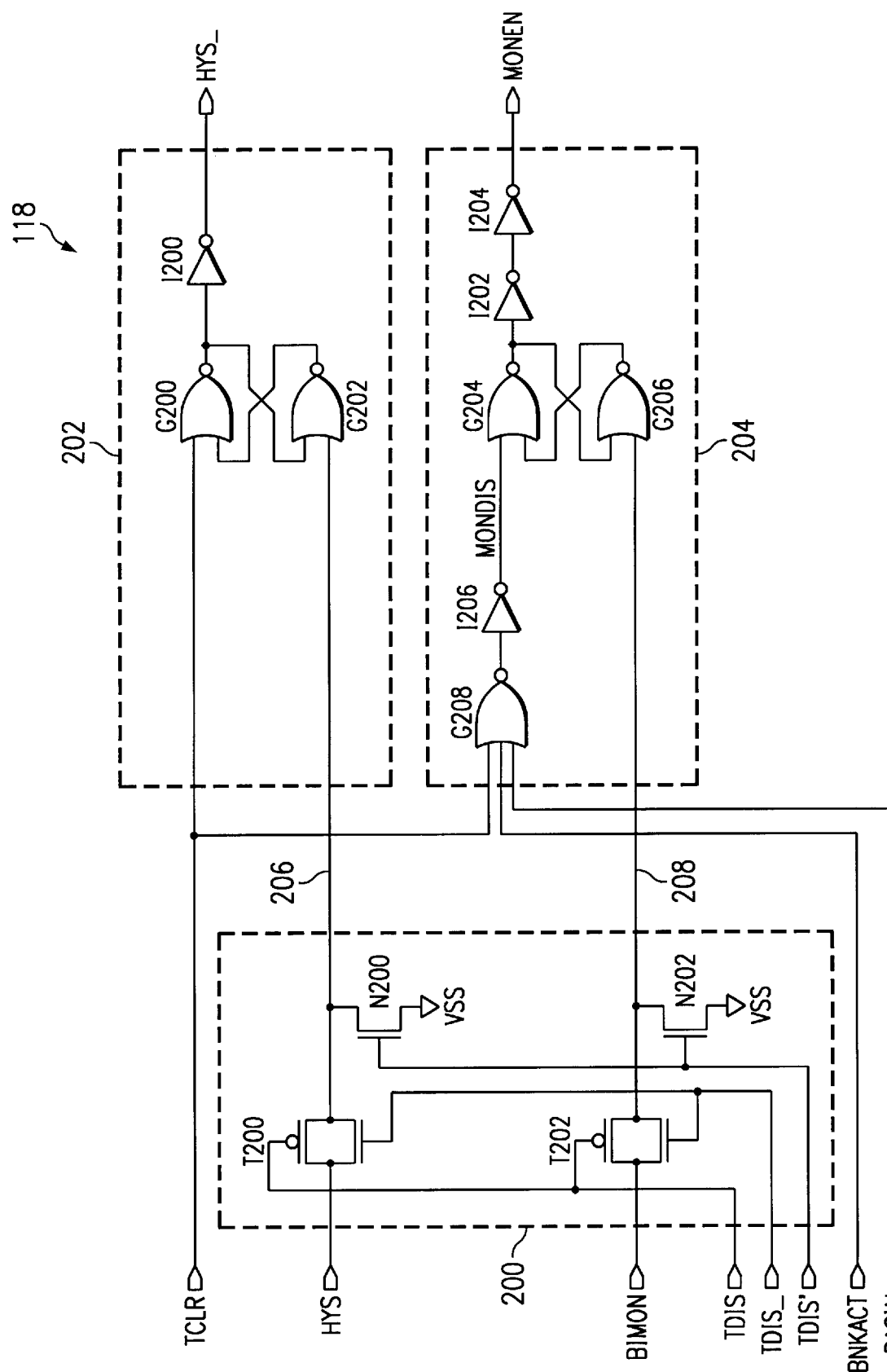
FIG. 2 is a schematic diagram illustrating a monitor circuit of the preferred embodiment.

Referring now to FIG. 2, a detailed schematic diagram is set forth illustrating a monitor circuit 118 of the preferred embodiment 100. The monitor circuit 118 can be conceptualized as including a mode data input section 200, a mode data output section 202, and a monitor control output section 204. When enabled, the mode data input section 200 receives mode data from the mode registers 112, and according to monitor control signals, allows the mode data values to generate mode and monitor output signals. When disabled, the mode data input section 200 disables the data signal inputs, and forces them to inactive ("default") values. In the preferred embodiment monitor circuit 200, the mode data received includes the HYS signal and the BLMON signal. The monitor control signals include the TDIS signal, its inverse TDIS_, and a third signal shown as TDIS', which is a delayed version of TDIS.

Within the mode data input section 200, the HYS signal is received by a complementary-metal(conductor)-oxide (insulator)-semiconductor (CMOS) transmission gate T200. The gate of the n-channel device of T200 receives the TDIS signal and the gate of the p-channel device receives the TDIS_ signal. The output of gate T200 provides a hysteresis output 206. A first n-channel MOS disable transistor N200 has a source-drain path coupled between the hysteresis output 206 and the low power supply voltage VSS. The gate of transistor N200 receives the TDIS' signal. In a like fashion, the BIMON signal passes through a CMOS transmission gate T202 to a monitor output 208. The monitor output 208 is coupled to the low power supply voltage VSS by the source-drain path of a second n-channel MOS disable transistor N202. The gates of transistors N200 and N202 are both coupled to the TDIS' signal. In this arrangement, in a burn monitor (BIMON high) and hysteresis enabled (HYS high) mode, TDIS and TDIS' are low and TDIS_ is high, enabling gates T200 and T202 and turning off transistor N200 and N202. The HYS and BIMON values are allowed to pass through the mode data input section 200 to the monitor control output section 204 and data output section 202, respectively. In contrast, to disable the monitor and hysteresis functions, TDIS (and subsequently TDIS') are driven high and TDIS_ goes low, turning off gates T200 and T202, and preventing the HYS and BIMON values from propagating through the data input section 200. Further, both transistors N200 and N202 are turned on, pulling the hysteresis output 206 and a monitor output 208 low. Transistors N200 and N202 can be considered default devices, as they will place their respective outputs (206 and 208) at a default (logic low) value when activated.

The data output section 202 includes two, two-input NOR gates G200 and G202, and an inverter I200. Gates G200 and G202 are arranged in a set-reset (SR) flip-flop configuration, with the output of gate G200 providing one input to gate G202, and vice versa. The other input of gate G200 receives the TCLR signal. The output of gate G200 is inverted by inverter I200 to generate the HYS_ signal. The second input of gate G202 is coupled to the hysteresis output 206. In this arrangement, provided TCLR is low (no "clear" condition), the output of inverter I200 will be the inverse of the logic level at the hysteresis output 206. However, if TCLR is high (a "clear" condition), the HYS_signal will be forced to the high logic level (indicating no hysteresis). In this manner, the SR flip-flop (G200/G202) alternately latches hysteresis data provided at the hysteresis output 206, or clears the value according to the TCLR signal.

The monitor control output section 204 has a similar configuration to the data output section 202, and includes two, two-input NOR gates G204 and G206, in an SR flip-flop arrangement. The output of gate G204 passes through two inverters I202 and I204, to provide the MONEN signal. The monitor control output section 204 is shown to further include a three-input NOR gate G208, arranged in series with an inverter I206. The output of inverter I206 can be considered a monitor disable signal MONDIS.

Gates G204 and G206, in conjunction with inverters I202 and I204, function in a similar fashion to the data output section 202. Provided the MONDIS signal is inactive (low), the MONEN signal will follow the value of the monitor output 208. In this manner, the SR flip-flop (G204/G206) latches the data provided at the monitor output 208.

However, in the event the MONDIS signal is active (high), the MONEN signal will be forced to an inactive (logic low) state. The inputs to gate G208 determine what conditions will disable the monitor mode. In the preferred embodiment monitor circuit 118, gate G208 receives the TCLR signal and the BNKACT signal as inputs. In addition, a third input, shown as RASIN is also applied to gate G208. The RASIN signal is a start-up signal that is initially high when the semiconductor memory device 100 is first powered up. The RASIN signal will subsequently be driven to a low logic level following the first active RAS_ pulse. In this arrangement, in the event a clear condition exists. (TCLR high), a bank activate command is received by the semiconductor memory device 100 (BNKACT high), or the semiconductor memory has powered up, and not yet received an active RAS_ signal, the MONEN signal will be forced low. Thus, advantageously, a bank activate command will automatically take the semiconductor memory device 100 out of the burn-in monitoring mode. allowing memory data to be provided at the data outputs D0–Dz, instead of the monitoring information. This eliminates the need to apply a separate command to take the semiconductor memory device 100 out of the burn-in monitor mode. Further, such a bank activation command will not remove hysteresis, allowing the semiconductor device to continue to operate more favorably in the noisy burn-in environment. Also, the parallel test, burst length, latency will continue to be applied to the device.

Figure 3:
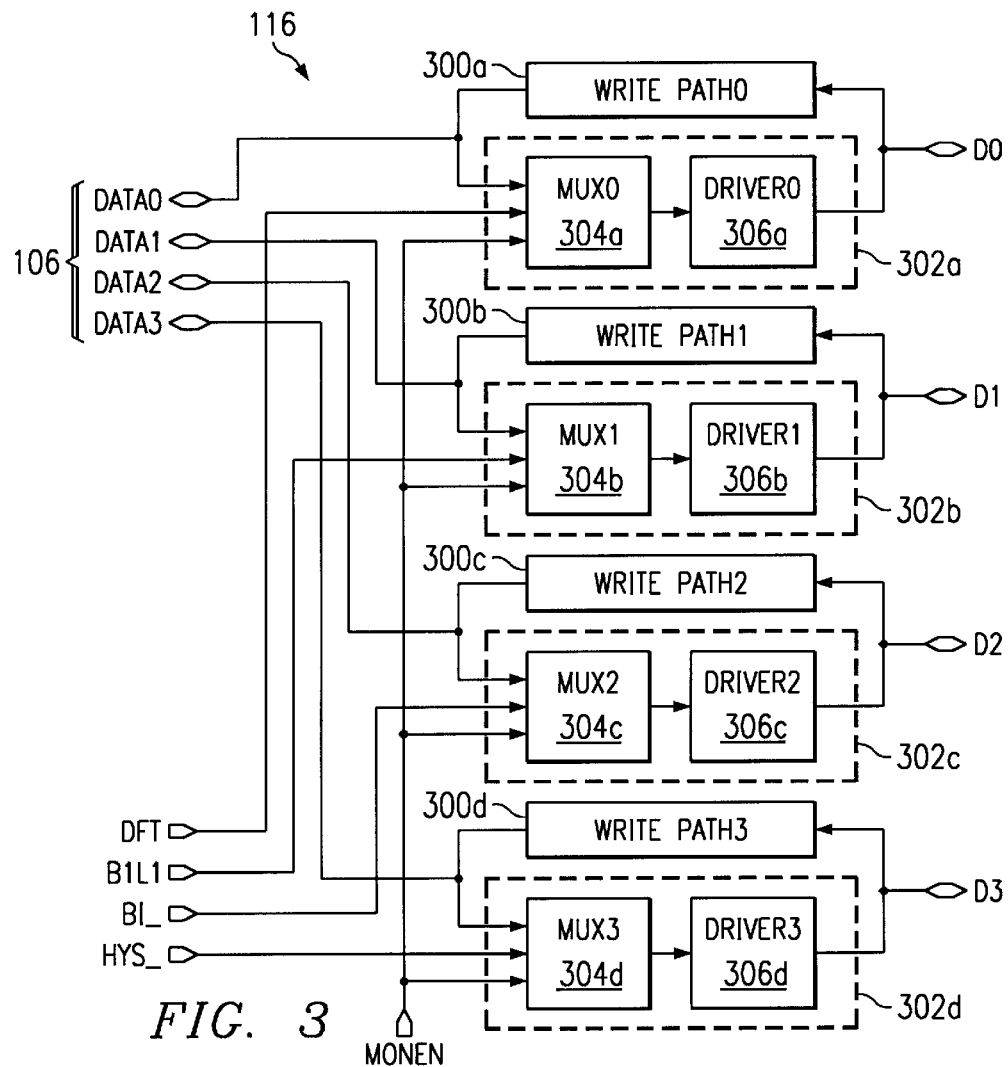
FIG. 3 is a block schematic diagram of a data buffer of the preferred embodiment.

Referring now to FIG. 3, a block schematic diagram is set forth illustrating the data buffer of the preferred embodiment 100. The data buffer is designated by the general reference character 116. In the particular arrangement of FIG. 3, the data buffer 116 is shown to include internal data lines, shown as DATA0–DATA3. Each of the internal data lines (DATA0–DATA3) is coupled to one of the data outputs (D0–D3) by an associated write path (300a–300d) and an associated read path (302a–302d). The write paths (300a–300d) are conventional in nature, amplifying input data signals on the data outputs D0–D3 in a write operation, in order to drive internal data lines DATA0–DATA3, respectively.

The read paths (302a–302d) each include a multiplexer portion (304a–304d) and a driver portion (306a–306d). In the preferred embodiment 100, each multiplexer portion (304a–304d) receives one input from an internal data line (DATA0–DATA3) and one input which carries one of the monitor data signals (DFT, B1L1, BI_ or HYS). In the particular arrangement of FIG. 3, the multiplexer portions (304a–304d) are commonly controlled by the MONEN signal. For one MONEN value, each multiplexer portion (304a–304d) couples a data value to its respective driver portion (306a–306d). For another MONEN value, each multiplexer portion (304a–304d) couples a monitor data signal (DFT, B1L1, BI_ or HYS) to its respective driver portion (306a–306d).

Figure 4:
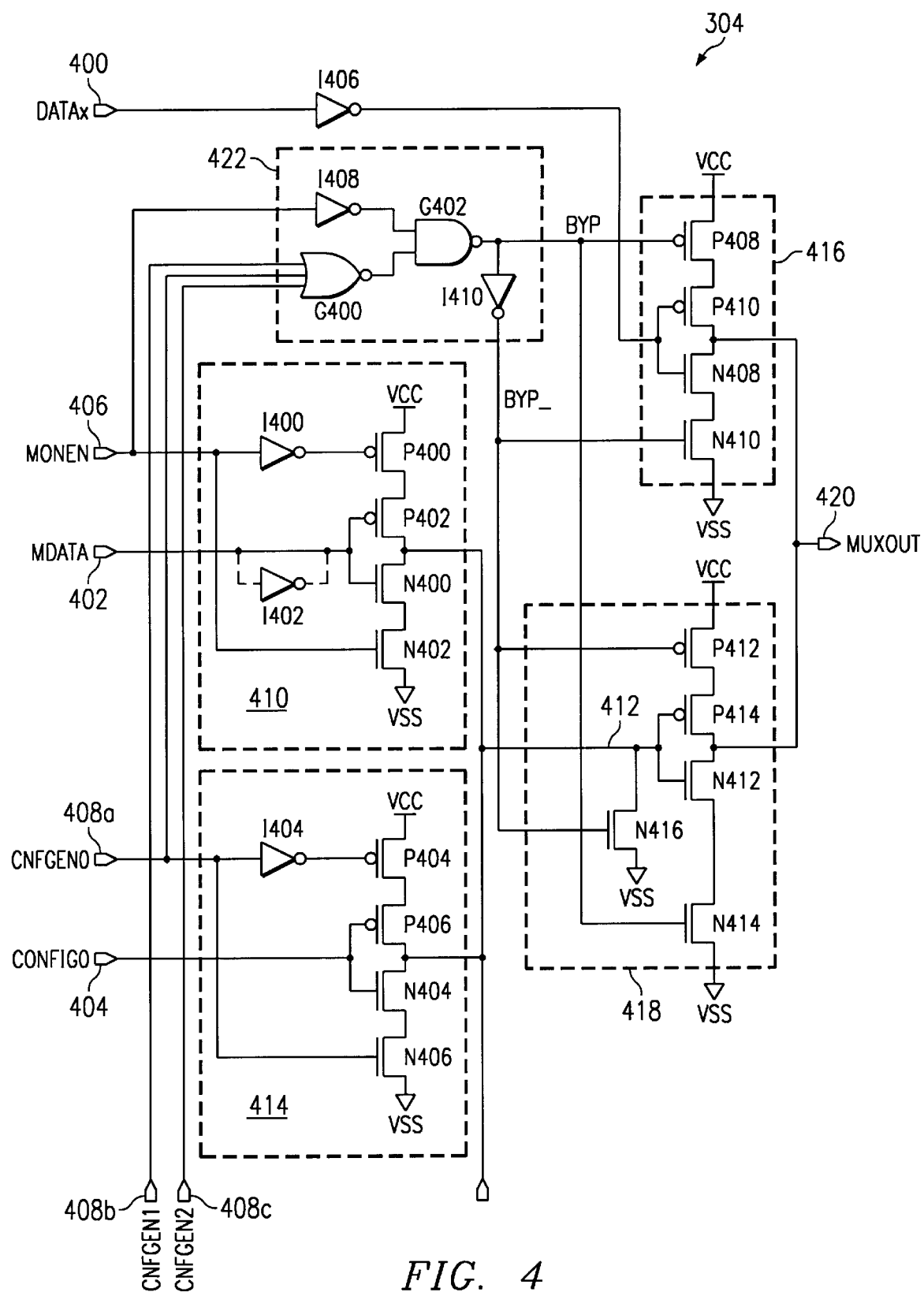
FIG. 4 is a schematic diagram illustrating a multiplexing portion of the preferred embodiment.

Referring now to FIG. 4 a schematic diagram is set forth illustrating a multiplexer portion of the preferred embodiment 100. The multiplexer portion is designated by the general reference character 304 and, can be employed as any of the multiplexer portions shown as 304a–304d in FIG. 3. The multiplexer portion 304 includes a read data input 400 for receiving output data from an internal data line, and a mode data input 402 for receiving a monitor data signal MDATA. The MDATA signal may be one of the monitor data signals previously described (such as the DFT, B1L1, BI_ or HYS signal). The read data input 400 can thus be considered as a first data input to the multiplexer portion 304, and the monitor data input 402 can be considered as a second data input to the multiplexer portion 304.

In addition to the mode data input 402, the multiplexer portion 304 includes additional test data inputs that receive device information that can be coupled to a data output in lieu of data signals. Thus, in the preferred embodiment, in addition to providing either output data or monitor data, each multiplexer portion 304 can provide other information on the semiconductor memory device 100 configuration. Thus, FIG. 4 shows a configuration data input 404. In the preferred embodiment 100, each multiplexer portion 304 includes three such configuration data inputs 404. One provides information that indicates whether row redundancy has been enabled. A second provides information that indicates whether column redundancy has been enabled. The final configuration data input provides information on the current revision of the semiconductor memory device 100. Accordingly, it is understood that in alternate modes, a command can be entered into the preferred embodiment, and the configuration information previously described will be provided at the data outputs in lieu of output data.

The multiplexer portion 304 also includes a monitor. enable input 406 that corresponds to the monitor data input 402. The monitor enable input 406 receives the MONEN signal. The monitor enable input 406 can thus be considered a control input to the multiplexer portion 304. In a similar arrangement, a configuration enable input 408a is provided that corresponds to the configuration data input 404. While only one configuration data input 404 is shown in FIG. 4, three configuration enable inputs are shown as 408a–408c. The configuration data input 404 is shown to receive a first configuration data signal CONFIG0 and the signal received by its corresponding configuration enable input 408a is shown as CNFGEN0. The other two configuration enable inputs (408b and 408c) receive CNFGEN1 and CNFGEN2 signals, respectively, and would correspond to two other configuration data signals CONFIG1 and CONFIG2 (not shown).

The MONEN and MDATA signals are coupled to a tri-state monitor driver 410. As is well understood, tri-state drivers provide one of three outputs in response to input signals; a logic high, a logic low, or a high impedance state. The monitor driver 410 includes two p-channel MOS transistors P400 and P402 having source-drain paths arranged in series between the high power supply voltage VCC and a configuration data output 412. In addition, two n-channel MOS transistors N400 and N402 have source-drain paths coupled between the configuration data output 412 and the low power supply voltage VSS. The MONEN signal is applied directly to the gate of transistor N402, and to the gate of transistor P400, by way of an inverter I400. The monitor data input 402 is coupled either directly to the gates of transistors P402 and N400. Alternately, the monitor data input 402 could be coupled to transistors P402 and N400 by way of an inverter I402. Whether or not an inverter is included in the path depends upon whether or not the signal at the monitor data input 402 is an active high signal, or an active low signal. Because the monitor data input 402 of FIG. 4 is an active high signal, no inverter is included. However, for the case of multiplexer section 304c in FIG. 3, because the BI_ signal is active low, an inverter, such as I402 would be included.

The CNFGEN0 and CONFIG0 signals are applied to a tri-state configuration driver 414. The configuration driver 414 has the same general configuration as the monitor driver 410, including two p-channel MOS transistors P404 and P406 having source-drain paths arranged in series with the source-drain paths of two n-channel MOS transistors, N404 and N406. The CNFGEN0 signal is applied to the gate of transistor N406 directly, and to the gate of transistor P404, by way of an inverter I404. The output of the configuration driver 414 is coupled to the configuration data output 412. Thus, the configuration data output 412 will provide the MDATA signal or the CONFIG0 data signal.

The DATAx signal is coupled to a standard tri-state driver 416 by an inverter I406. In a similar fashion, the configuration data output 412 is coupled to a bypass tri-state driver 418. The outputs of the standard driver 416 and bypass driver 418 are commonly coupled to a MUX output 420. The standard driver 416 includes two p-channel MOS transistors P408 and P410 having source-drain paths arranged in series with two n-channel MOS transistors N408 and N410. The inverted DATAx signal is received at the commonly connected gates of transistors P410 and N408.

In a similar fashion to the standard driver 416, the bypass driver 418 includes the series arrangement of two p-channel and two n-channel MOS transistors (P412, P414, N412 and N414). The configuration data output 412 is received at the commonly connected gates of transistors P414 and N412. The bypass driver 418 further includes an n-channel MOS disable transistor N416 having source-drain path couple between the data output 412 and the low power supply voltage VSS. The disable transistor N416 can be considered a default establishing device as it will place the data output 412 at a default (logic low) value when enabled.

The standard driver 416 and bypass driver 418 are both controlled by a bypass enable circuit 422. that is shown in FIG. 4 to include inverters I408 and I410, three-input NOR gate G400, and two-input NAND gate G402. Inverter I408 receives the MONEN signal at its input, and has its output coupled to one of the inputs of gate G402. Gate G400 receives the configuration enable signals (CNFGEN0–CNFGEN2) as inputs, and has its output coupled to the other input of gate G402. The output of gate G402 provides a bypass signal BYP. The BYP signal is inverted by inverter I410 to generate the signal BYP__. In this arrangement, when the MONEN signal and configuration enable signals (CNFGEN0–CNFGEN2) are all low, indicating that mode data and/or configuration is not to be output, the BYP signal will be low (and BYP__ high). As a consequence, the standard driver 416 will be enabled, as transistors P408 and N410 will be turned on, and the MUX output 420 will be driven according to the DATAx signal. The bypass driver 418 will be disabled, as transistors P412 and N414 will be turned off. Furthermore, transistor N416 will be turned on, pulling the configuration data output 412 to a low potential level. In this manner, in a standard mode of operation, the multiplexer section will provide read data as an output.

In contrast, if the MONEN signal, or any of the configuration enable signals (CNFGEN0–CNFGEN2) are high, indicating that mode data or configuration data is to be output, the BYP signal will be high (and BYP__ low), resulting in the standard driver 416 being disabled, and the bypass driver 418 enabled. Transistor N416 is turned off, allowing the configuration data output 412 to be driven according to the MDATA signal, in the event the MONEN signal is high, or by one of the configuration data signals (CONFIG0–CONFIG2), in the event one of the configuration enable signals (CNFGEN0–CNFGEN2) is high. The bypass driver 418 will drive the MUX output 420 according to the logic level of the configuration data output 412. In this manner, the standard data output path can be bypassed to provide mode or configuration data instead of memory cell data.

Figure 5:
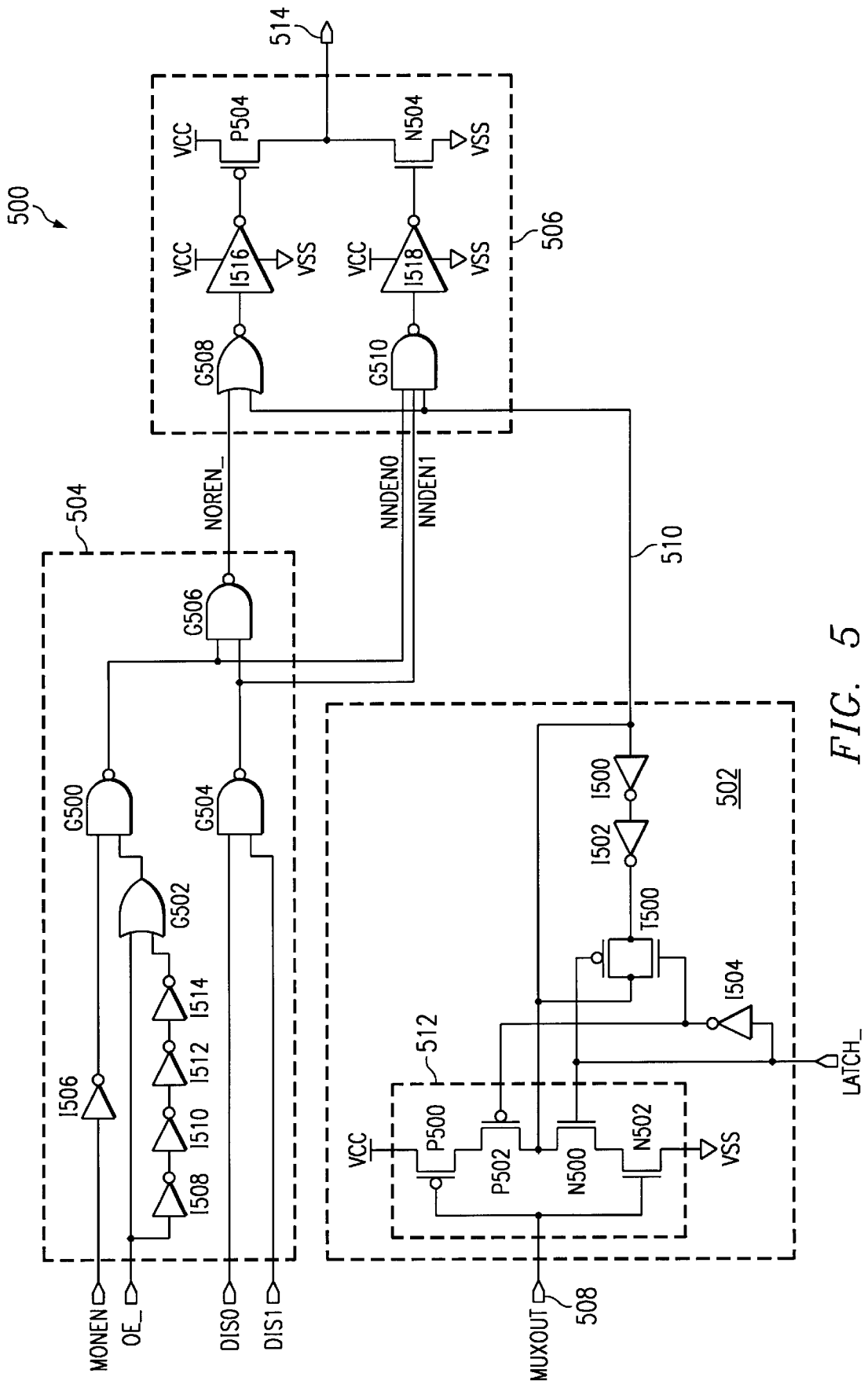
FIG. 5 is a schematic diagram illustrating an output driver of the preferred embodiment.

Referring now to FIG. 5, a schematic diagram is set forth illustrating an output driver according to a preferred embodiment. The output driver may be employed as any of the output driver portions (306a–306d) shown in FIG. 3. The output driver of FIG. 5 is designated by the general reference character 500, and can be conceptualized as including a driver data section 502, a driver control section 504, and a driver buffer section 506.

The driver data section 502 receives input data at a driver input node 508, and latches the data at a data output node 510 in response to a latching signal LATCH__. The driver data section 502 is shown to include a latch driver 512, which includes the series arrangement of two p-channel MOS transistors P500 and P502 and two n-channel N500 and N502. The gates of transistors P500 and N502 are commonly coupled to the driver input node 508. The output of latch driver 512 is coupled to the data latch node 510. The driver data section 502 further includes a feedback path formed by the series arrangement of two inverters I500 and I502 and a CMOS transmission gate T500. The LATCH__ signal is applied directly to the gate of transistor N500 within the latch driver 512, and the p-channel device of transmission gate T500. The LATCH__ signal is inverted by inverter I504, and applied to the gate of transistor P502 within the latch driver 512, and to the n-channel device of transmission gate T500. In this arrangement, when the LATCH__ signal is high. the latch driver 512 is enabled, and will drive the data latch node 510 according to the logic at the driver input node 508. The feedback path is disabled, as gate T500 is turned off. When the LATCH__ signal is low, the latch driver 512 is disabled, and the feedback path enabled, and the data value at the data latch node 510 is latched.

The driver control section 504 receives a number of driver control signals, including the MONEN signal, previously described, as well as an output enable signal OE__. In addition, the driver control section 504 receives two disable signals, shown as DIS0 and DIS1. In response to an active (high) MONEN signal, or an active (low) OE__ signal, the driver control section 504 will provide output signals which enable the driver buffer section 506 to drive a data output node 514 according to the logic at the data latch node 510. In the event both of the disable signals (DIS0 and DIS1) are high, the driver buffer section 506 will be disabled, regardless of the values of the MONEN and OE__ signals.

The MONEN signal is inverted within the driver control section 504 by an inverter I506. The output of inverter I506 provides one input to a two-input NAND gate G500. The OE__ signal is applied directly as one. input to a two-input OR gate G502, and as a second input to gate G502, by a delay inverter chain, which includes the series arrangement of inverters I508, I510, I512 and I514. The output of gate G502 provides a second input to gate G500. The delay inverter chain will introduce a delay between a high-to-low transition in the OE__ signal, and the resulting high-to-low transition at the output of gate G502. The signal provided by the output of gate G500 is shown as NNDEN0. In this arrangement, when MONEN is high or OE__ is low, the NDNEN0 signal will be driven high. In the event MONEN is low and OE__ is high, however, the NDNEN0 signal will be low.

The DIS0 and DIS1 signals are received as inputs to a two-input NAND gate G504. The signal provided by the output of gate G504 is shown as NNDEN1. Thus, in the event either of the disable signals (DIS0 and DIS1) is low, the NNDEN1 signal will be high. However, in the event both the DIS0 and DIS1 signals are high, the NNDEN1 signal will be low. The NNDEN0 signal and NNDEN1 signal are provided as inputs to a two-input NAND gate G506. The signal provided by the output of gate G506 is shown as NOREN__. Thus, in the event the NNDEN0 and NNDEN1 signals are both high, the NOREN__ signal will be driven low.

The NNDEN0, NNDEN1 and NOREN__ signals are provided as control inputs to the driver buffer section 506.

The driver buffer section 506 receives a data signal from the data latch node 510 within the driver data section, and the control signals NNDEN0, NNDEN1 and NOREN__. In response to these signals, the driver buffer section 506 either drives the data output node 514 according to the data at the data latch node 510, or places the data output node 514 in a tri-state (high impedance) state.

The driver buffer section 506 of the preferred embodiment 500 is shown to include a two-input NOR gate G508 and a three-input NAND gate G510. Gate G508 receives a data signal from the data latch node 510 at one input, and the NOREN__ signal at the other input. Similarly, gate G510 receives the data signal from the data latch node 510 at a first input, the NNDEN0 signal at a second input, and the NNDEN1 signal at a third input. The output of gate G508 is coupled to the input of a p-channel driver I516. Driver I516, in turn, drives a p-channel pull-up device P504. The output of gate G510 drives an n-channel pull-down device N504, by way of an n-channel driver I518.

In operation, when the NNDEN0 and NNDEN1 signals are both high, gates G508 and G510 are enabled (they are "enabled" in the sense that their outputs will be dependent upon the logic at the data latch node 510), and the data output node 514 will be driven to a high or low potential according to the data latch node 510 logic level. For example, provided NNDEN0 and NNDEN1 are high. when a logic low is latched at the data latch node 510, the gate of transistor P504 will be driven low, pulling the data output node 514 to a high voltage.

Transistor N504 will be turned off as its gate will be driven low. Conversely, when NNDEN0 and NNDEN1 are high, and the data latch stores a logic high value, transistor P504 will be turned off, and transistor N504 will be turned on, driving the output node 514 to a low voltage.

If either of the NNDEN0 or NNDEN1 signals are low, the driver buffer section 506 is disabled. When NNDEN0 or NNDEN1 is low, the output of gate G508 will be forced low and the output of gate G510 will be forced high. Transistors P504 and N504 will be turned off, creating a high impedance state at the data output node.

Figure 6:
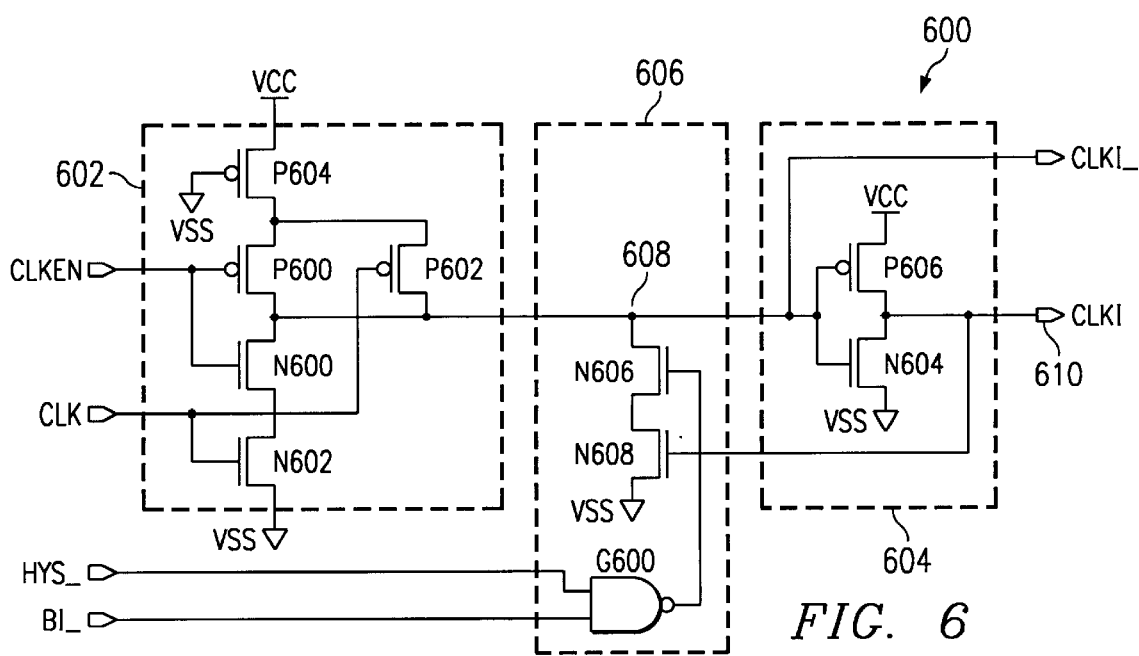
FIG. 6 is a schematic diagram illustrating a clock buffer circuit of the preferred embodiment.

FIG. 6 sets forth a clock buffer circuit that may be used as the clock buffer circuit 114 in FIG. 1. The clock buffer circuit is designated by the general reference character 600, and is shown to include a clock input section 602, a clock output section 604, and a hysteresis control section 606. The clock input. section 602 includes a two p-channel MOS transistors P600 and P602. and two n-channel MOS transistors N600 and N602, arranged in a NAND gate configuration. The gates of transistors P600 and N600 receive a clock enable signal CLKEN, and the gates of transistors P602 and N602 receive an external clock signal CLK. The common sources of transistors P600 and P602 are coupled to the high power supply voltage by the source-drain path of a p-channel MOS current supply transistors P604. Transistor P604 has a gate coupled to the low power supply VSS. The output of the NAND gate is coupled to first clock node 608, which provides the internal clock signal CLKI__. In this arrangement, provided CLKEN is high, the clock node will be driven according to the CLK signal, so that CLKI__ is the inverse of the CLK signal.

The clock output section 604 includes a p-channel MOS transistor P606 and an n-channel MOS transistor N604 arranged in a CMOS inverter configuration. The clock output section 604 drives a second clock node 610 according to the potential of the first clock node 608. Thus, the second clock node 610 provides the internal clock signal CLKI, which is the inverse of the CLKI__ signal.

The hysteresis control section 606 includes two n-channel MOS transistors, N606 and N608, arranged in series between the first clock node 608 and the low power supply voltage VSS. The gate of transistor N608 is coupled to the second clock node 610. The gate of transistor N606 is driven by a two-input NAND gate G600. Gate G600 receives the HYS__ signal and BI__ signal as inputs. When either of the HYS__ signal or BI__ signals is low (active) a high voltage is applied to the gate of transistor N606, enabling hysteresis in the clock buffer circuit 600. Thus, hysteresis is introduced into the clock signals (CLKI__ and CLKI) when the device is in the burn-in mode (i.e., BI__ low), and can also be introduced by placing the SDRAM into a "hysteresis enabled" mode (i.e., HYS__ low), via the entry of a command. This. arrangement allows the clock buffer circuit 600 to exit the burn-in mode (BI__ goes high) yet still maintain hysteresis (HYS__ stays low).

It is understood that while the present invention has been described in terms of a detailed preferred embodiment, various changes, substitutions, and alterations could be made without departing from the spirit and scope of the invention. Accordingly, the present invention is intended to be limited only as defined by the appended claims.

What is claimed is:

1. A memory device, comprising:
    a memory bank including a plurality of memory cells;
    a data bus coupled to the memory bank;
    a plurality of data outputs;
    a plurality of storage registers that store burn-in mode information, and burn-in mode monitor information;
    a monitor circuit coupled to at least one storage register, the monitor circuit activating a monitor enable signal when the burn-in monitor information indicates a burn-in monitor mode; and
    a data buffer coupled to the data bus and the storage registers, the data buffer including
        an output data path that couples the data bus to the data outputs, the output data path being disabled when the monitor enable signal is active, and
        a monitor data path that couples burn-in mode information to the data outputs, the monitor data path being enabled when the monitor enable signal is active.

2. The memory device of claim 1, wherein:
    the memory device includes a plurality of memory cell banks, the memory cells of a selected bank being coupled to the data bus when the selected bank is activated;
    the monitor circuit places the monitor enable signal in an inactive state when a selected bank is activated; and
    a data buffer includes the monitor data path being disabled when the monitor enable signal is inactive.

3. The memory device of claim 1, wherein:
    the burn-in mode information stored within the plurality of storage registers includes information that indicates when the random access memory device is in a burn-in mode.

4. The memory device of claim 3, further including:
a clock buffer circuit coupled to at least one of the storage registers, the clock buffer circuit receiving an external system clock and generating an internal clock synchronous with the external system clock, the clock buffer circuit including a hysteresis control circuit that introduces hysteresis into the internal clock signal with respect to the external system clock, when enabled, the hysteresis control circuit being enabled when the burn-in mode information indicates the burn-in mode.

5. The memory device of claim 4, further including:
the burn-in mode information stored within the plurality of storage registers includes information indicating if hysteresis for the internal clock has been enabled by a command entry; and
the hysteresis control circuit of the clock buffer circuit is further enabled when the burn-in mode information indicates hysteresis is enabled.

6. The memory device of claim 1, wherein:
the burn-in mode information stored within the plurality of storage registers includes design-for-test mode information.

7. The memory device of claim 1, wherein:
the random access memory device is a synchronous random access memory; and
the burn-in mode information stored within the plurality of storage registers includes burst length information.

8. The memory device of claim 1, wherein:
the random access memory device is a synchronous random access memory; and
the burn-in mode information stored within the plurality of storage registers includes latency information.

9. The memory device of claim 1, wherein:
the random access memory device is a synchronous random access memory that includes an internal clock that is synchronous with an external system clock; and
the burn-in mode information stored within the plurality of storage registers includes information indicating if hysteresis for the internal clock is enabled.

10. A semiconductor memory device having a burn-in mode, comprising:
a data buffer that includes
a plurality of data read paths, each data read path including a multiplexer (MUX) circuit having at least a MUX first data input, a MUX second data input, a MUX data output, and a MUX control input, the MUX coupling the MUX first data input to the MUX data output when a first value is at the MUX control input, the MUX coupling the MUX second data input to the MUX data output when a second value is at the MUX control input;
a monitor enable circuit commonly coupled to the MUX control inputs of the data read paths, the monitor enable circuit generating the second value at the MUX control inputs when the semiconductor memory device is in a burn-in monitor mode; and
a data bus that provides memory bank data to the MUX first data inputs of the data read paths;
a mode register circuit that provides burn-in mode information to the MUX second data inputs of the data read paths; and
a data input/output (I/O) coupled to each MUX data output of the data buffer.

11. The semiconductor memory device of claim 10, wherein:
the MUX of each data read path includes a standard driver coupled to the MUX first data input and a bypass driver coupled to the MUX second data inputs, the standard driver being enabled and the bypass driver being disabled by the first value at the MUX control input, the standard driver being disabled and the bypass driver being enabled by the second value at the MUX control input.

12. The semiconductor memory device of claim 11, wherein:
each standard driver includes a three-state driver having one input coupled to the MUX first data input, and a second input coupled to the MUX control input.

13. The semiconductor memory device of claim 11, wherein:
each bypass driver includes a three-state driver having one input coupled to the MUX second data input, and a second input coupled to the MUX control input.

14. The semiconductor memory device of claim 11, wherein:
each bypass driver further includes a bypass default device coupled between the MUX second data input and a predetermined logic value, the bypass default device coupling the MUX second data input to the predetermined logic value when the second value is at the MUX control input.

15. The semiconductor memory device of claim 10, wherein:
the monitor enable circuit includes
a monitor enable input, and
monitor enable latching circuit that latches the logic value at the monitor enable input to provide the value at the MUX control input of the data read paths.

16. The semiconductor memory device of claim 15, wherein:
the monitor enable latch includes a set-reset flip-flop (SR-FF).

17. The semiconductor memory device of claim 16, wherein:
the semiconductor memory device generates a test clear signal to take the semiconductor memory device out of a burn-in monitor mode; and
the SR-FF has a set input coupled to monitor enable input and a reset input coupled to the test clear signal.

18. The semiconductor memory device of claim 15, wherein:
the monitor enable circuit further includes a monitor default device coupled between the monitor enable input and a predetermined logic value, the monitor default device coupling the monitor enable input to the predetermined logic value when enabled.

19. The semiconductor memory device of claim 18, wherein:
the semiconductor memory device includes a plurality memory cell banks, and generates a bank activate signal when a memory bank is accessed; and
the monitor default device is enabled by a bank activate signal.

20. The semiconductor memory device of claim 15, wherein:
the monitor enable input is coupled to the monitor enable latching circuit by a transmission gate.

* * * * *